US009196724B2

(12) United States Patent
Darwish et al.

(10) Patent No.: US 9,196,724 B2
(45) Date of Patent: Nov. 24, 2015

(54) LATERAL DEVICES CONTAINING PERMANENT CHARGE

(71) Applicant: MaxPower Semiconductor, Inc., San Jose, CA (US)

(72) Inventors: Mohamed N. Darwish, Campbell, CA (US); Amit Paul, Sunnyvale, CA (US)

(73) Assignee: MaxPower Semiconductor Inc., San Jose, CA (US)

( * ) Notice: Subject to any disclaimer, the term of this patent is extended or adjusted under 35 U.S.C. 154(b) by 0 days.

(21) Appl. No.: 14/600,712

(22) Filed: Jan. 20, 2015

(65) Prior Publication Data

US 2015/0295083 A1    Oct. 15, 2015

Related U.S. Application Data

(63) Continuation of application No. 14/168,300, filed on Jan. 30, 2014, now Pat. No. 8,946,769, which is a continuation of application No. 13/693,637, filed on Dec. 4, 2012, now Pat. No. 8,674,403, which is a continuation of application No. 12/432,917, filed on Apr. 30, 2009, now Pat. No. 8,330,186.

(60) Provisional application No. 61/084,639, filed on Jul. 30, 2008.

(51) Int. Cl.
| *H01L 29/66* | (2006.01) |
|---|---|
| *H01L 29/78* | (2006.01) |
| *H01L 29/16* | (2006.01) |
| *H01L 29/10* | (2006.01) |
| *H01L 29/06* | (2006.01) |
| *H01L 29/40* | (2006.01) |
| *H01L 29/423* | (2006.01) |

(52) U.S. Cl.
CPC ........ *H01L 29/7825* (2013.01); *H01L 29/0634* (2013.01); *H01L 29/1095* (2013.01); *H01L 29/16* (2013.01); *H01L 29/408* (2013.01); *H01L 29/42368* (2013.01); *H01L 29/7835* (2013.01)

(58) Field of Classification Search
CPC ............................ H01L 21/336; H01L 29/784
USPC ......... 257/122, 141, 331, 335, 336, 339, 343, 257/408, 409, 493
See application file for complete search history.

(56) References Cited

FOREIGN PATENT DOCUMENTS

JP            05102179 A  *   4/1993   ............ H01L 21/336

* cited by examiner

*Primary Examiner* — Telly Green
(74) *Attorney, Agent, or Firm* — Groover & Associates PLLC; Robert O. Groover, III; Gwendolyn S. S. Groover

(57) ABSTRACT

A lateral device includes a gate region connected to a drain region by a drift layer. An insulation region adjoins the drift layer between the gate region and the drain region. Permanent charges are embedded in the insulation region, sufficient to cause inversion in the insulation region.

20 Claims, 14 Drawing Sheets

2300

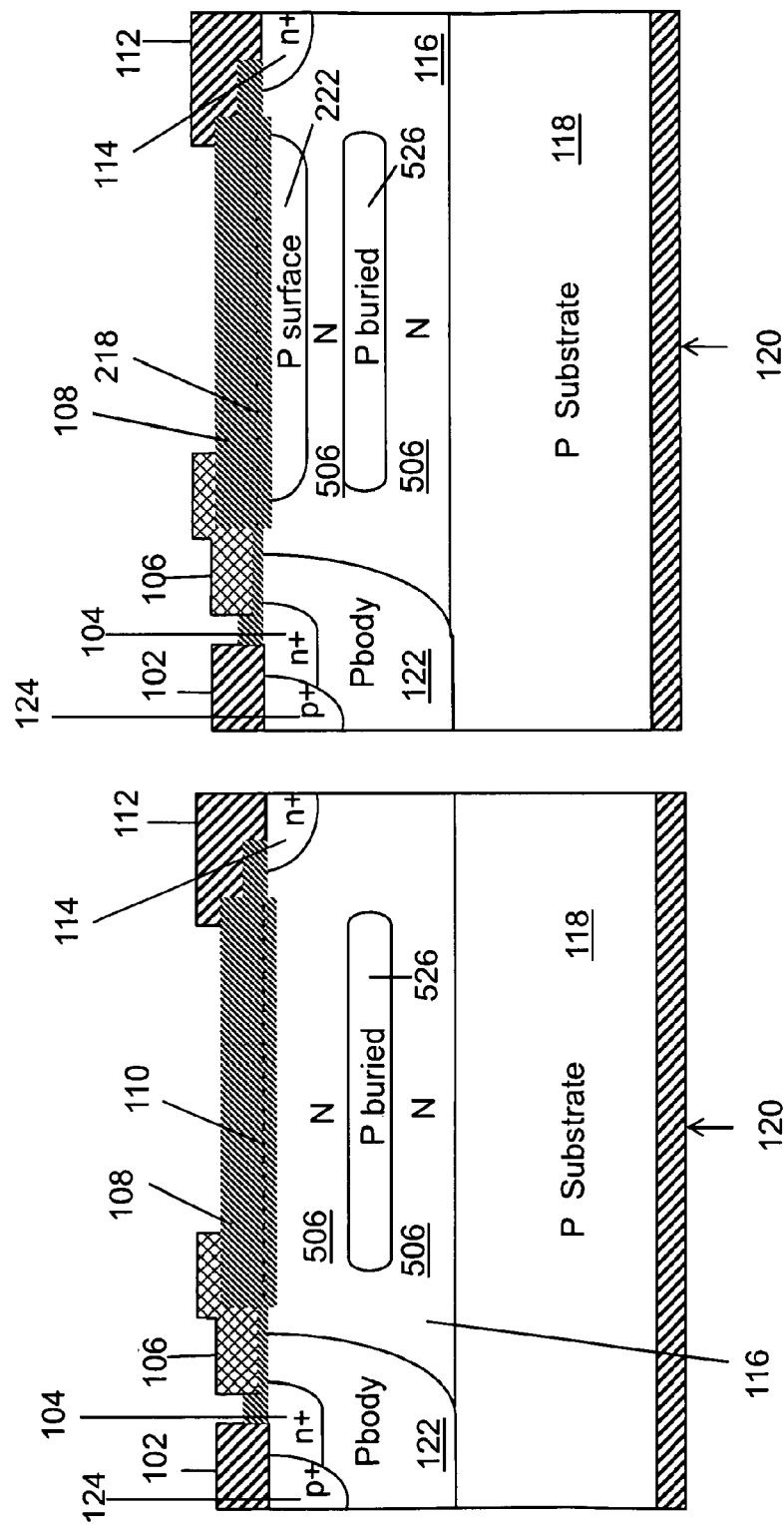

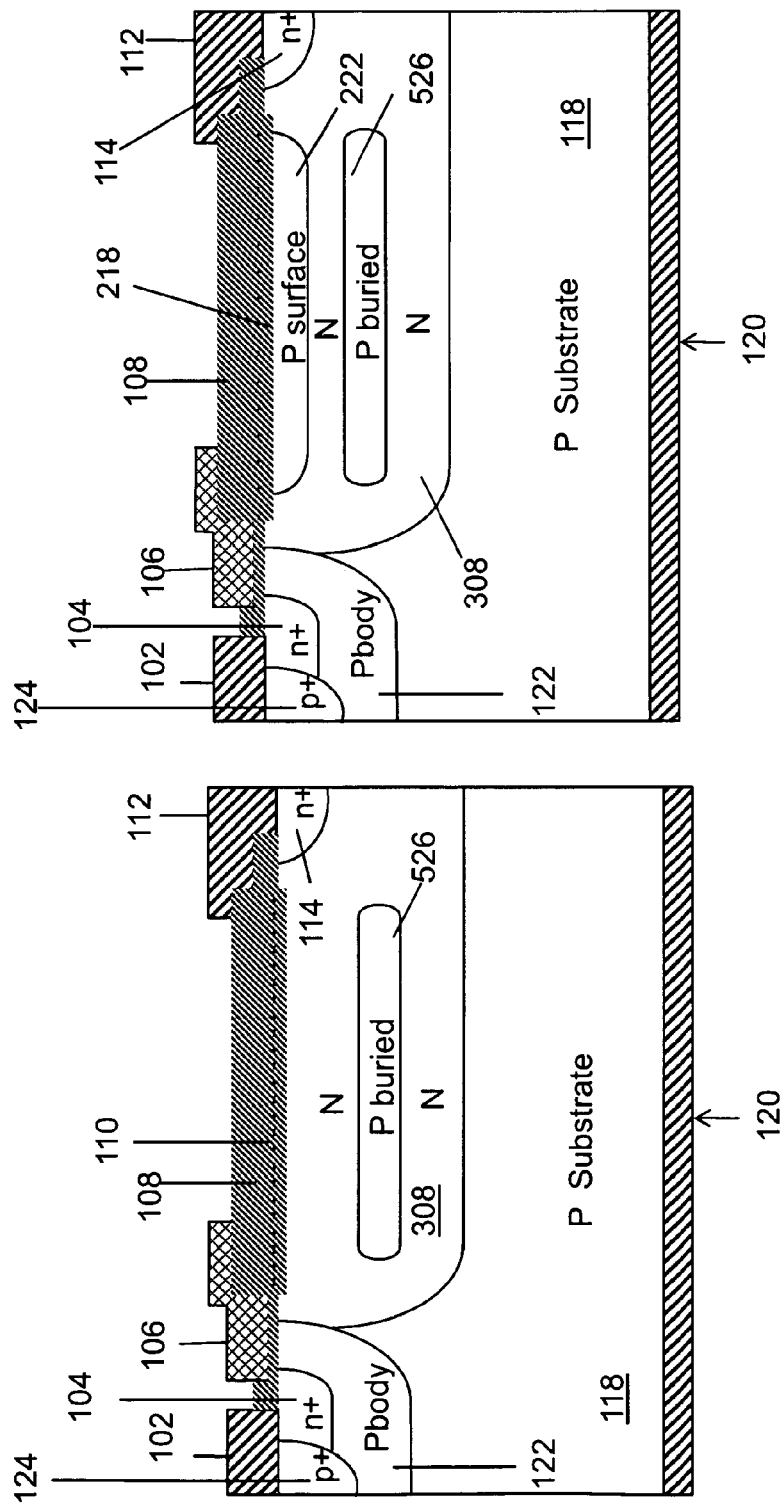

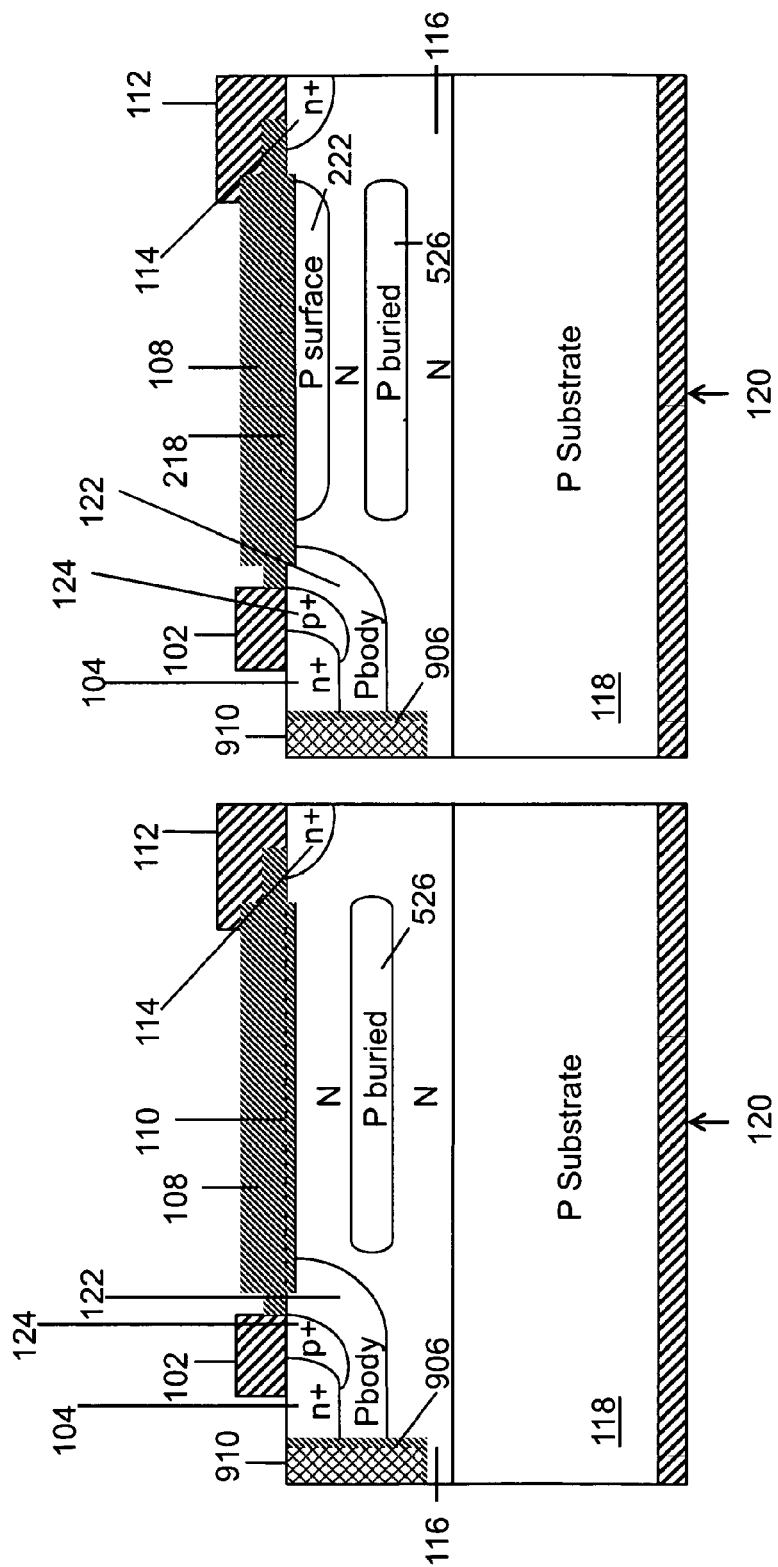

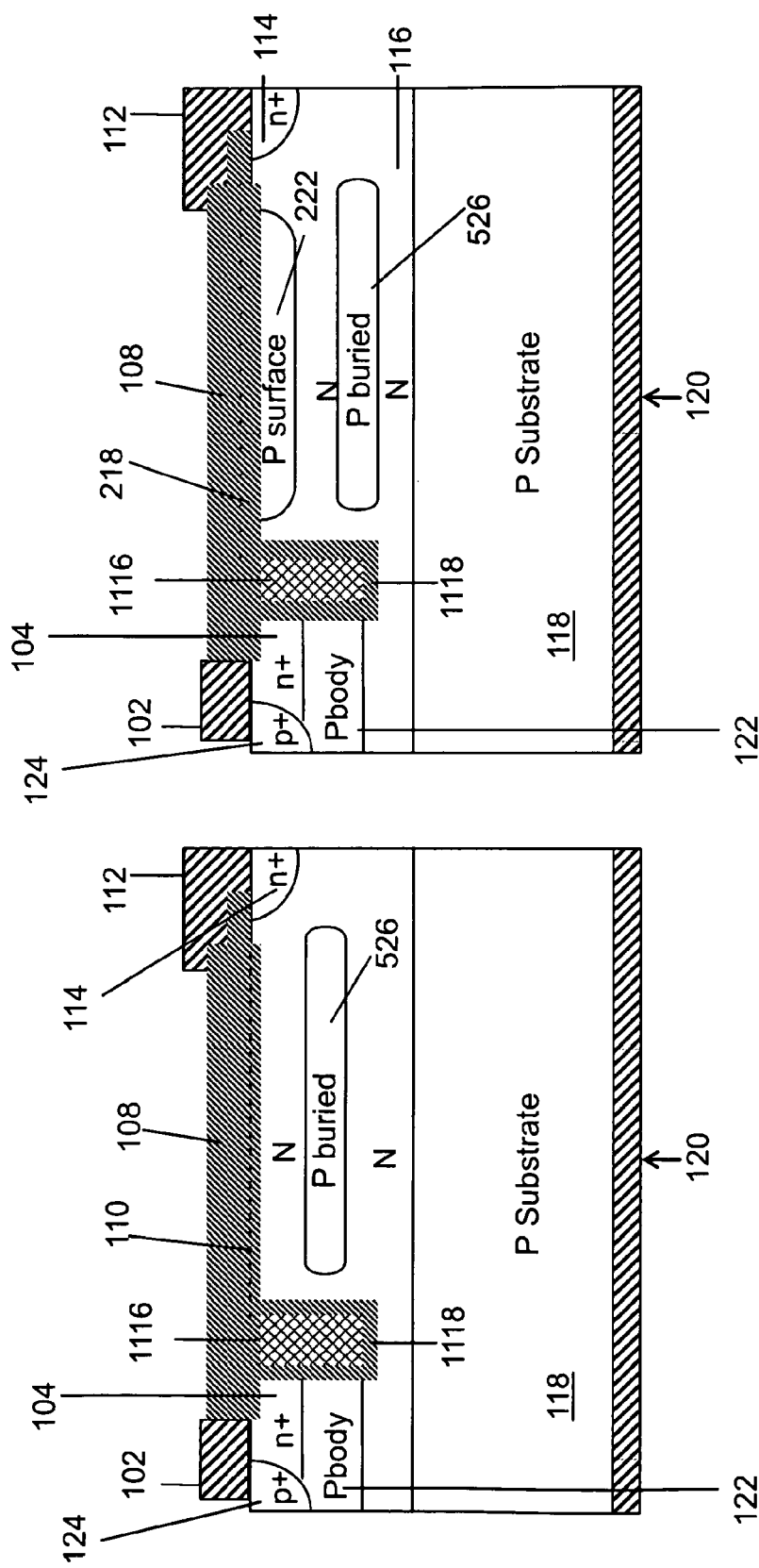

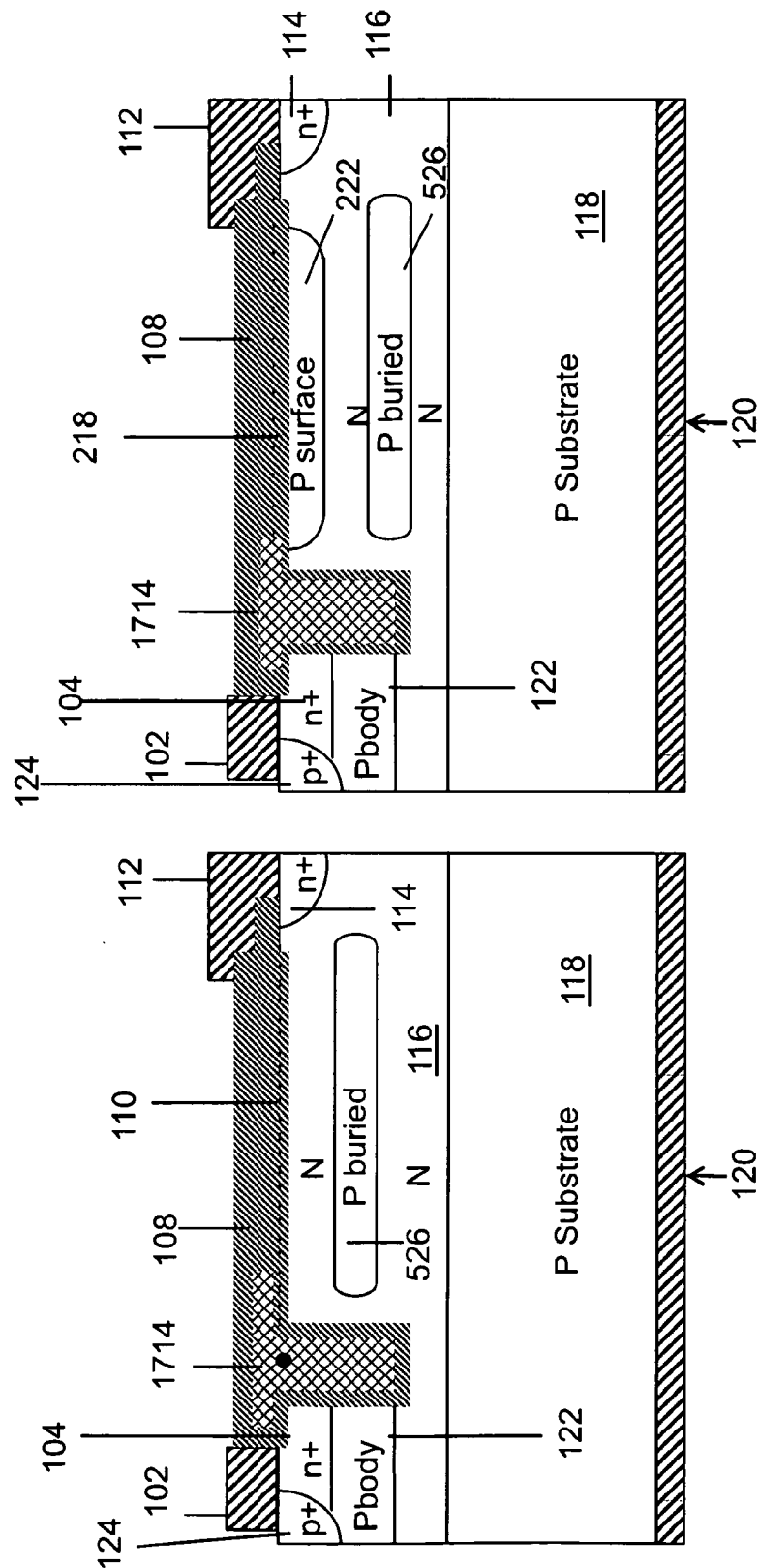

LATERAL DEVICES CONTAINING PERMANENT CHARGE

CROSS-REFERENCE TO OTHER APPLICATION

Priority is claimed from U.S. Provisional Application 61/084,639, filed Jul. 30, 2008, which is hereby incorporated by reference.

BACKGROUND

The present application relates to lateral power switches, and more particularly to lateral power semiconductor devices having insulation material including permanent electrostatic charges.

Note that the points discussed below may reflect the hindsight gained from the disclosed inventions, and are not necessarily admitted to be prior art.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 2(*b*) is a structural diagram depicting a lateral device in accordance with an embodiment;

FIG. 2(*c*) is a structural diagram depicting a lateral device in accordance with an embodiment;

FIG. 5 is a structural diagram depicting a lateral device in accordance with an embodiment;

FIG. 6 is a structural diagram depicting a lateral device in accordance with an embodiment;

FIG. 7 is a structural diagram depicting a lateral device in accordance with an embodiment;

FIG. 8 is a structural diagram depicting a lateral device in accordance with an embodiment;

FIG. 13 is a structural diagram depicting a lateral device in accordance with an embodiment;

FIG. 14 is a structural diagram depicting a lateral device in accordance with an embodiment;

FIG. 15 is a structural diagram depicting a lateral device in accordance with an embodiment;

FIG. 16 is a structural diagram depicting a lateral device in accordance with an embodiment;

FIG. 17 is a structural diagram depicting a lateral device in accordance with an embodiment;

FIG. 18 is a structural diagram depicting a lateral device in accordance with an embodiment;

DETAILED DESCRIPTION OF SAMPLE EMBODIMENTS

Power switches such as MOSFET devices are widely used as switching devices in many electronic applications. In order to minimize conduction and switching power loss, it may be desirable that power MOSFETs for a given breakdown voltage have low specific on-resistance and capacitances. Specific on-resistance (Rsp) may be defined as the product of the on-resistance (Ron) and the area (A) of a device. Reduced Surface Field (RESURF) structures such as double RESURF and Double Conduction (DC) structures may provide lower Rsp than conventional lateral MOSFET structures. However, such structures may not meet the increasing requirement of reduced Rsp and capacitances for many new applications.

The use of permanent or fixed charge within insulation regions has been demonstrated as advantageous in the fabrication of semiconductor devices such as depletion mode vertical double-diffused metal-oxide-semiconductor (DMOS) transistors and solar cells. Permanent charges can be supplied, for instance, by the implantation of a selected atomic species such as Cesium into an insulator, or the use of dielectric layers such as silicon oxide in combination with plasma enhanced chemical vapor deposition (CVD) of silicon nitride or Aluminum Fluoride (AlF3).

A lateral device includes a gate region connected to a drain region by a drift layer. An insulation region adjoins the drift layer between the gate region and the drain region. Permanent charges are embedded in the insulation region, or the semiconductor/insulator interface, sufficient to cause inversion in the insulation region.

The disclosed innovations, in various embodiments, provide one or more of at least the following advantages. However, not all of these advantages result from every one of the innovations disclosed, and this list of advantages does not limit the various claimed inventions.

higher breakdown voltage;
charge balancing;
uniform electric fields.

The numerous innovative teachings of the present application will be described with particular reference to presently preferred embodiments (by way of example, and not of limitation).

Permanent charges can be incorporated into the construction of high voltage devices where the permanent charge provides the charge balance needed for high breakdown voltage. The device in the following embodiments is a MOSFET but the design can be applicable to other devices such as diodes, JFETs, IGBTs, thyristors and other devices that can block voltages.

Lateral structures can make use of permanent charge for charge balance. Under reverse-bias, electric field lines emanating from ionized doping atoms in the depletion region can be terminated by the permanent charge resulting in more uniform electric field and higher breakdown voltage compared to conventional devices.

Figure 1:
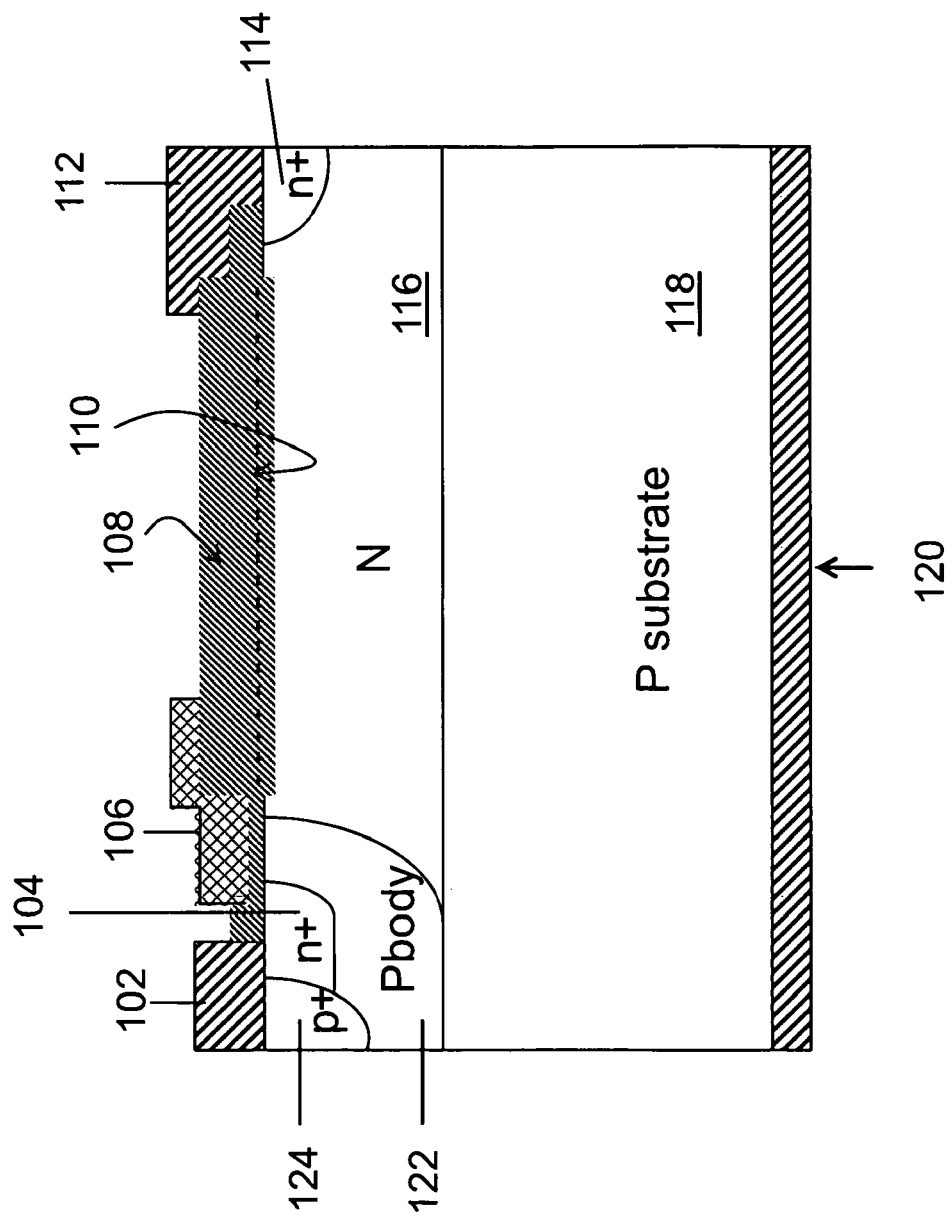
FIG. 1 is a structural diagram depicting a lateral device in accordance with an embodiment.

With reference to FIG. 1, a structural diagram depicts a lateral n-channel transistor 100 with an n-type drift region 116, in accordance with an embodiment. A backside metallization layer 120 adjoins a substrate 118. Since this a lateral device, a ground connection will be present on the front side of the device. Backside metallization 120 can be used for a ground connection to substrate 118, and can also be used to assure good mechanical and thermal connection to a package in which the device 100 will be mounted.

Substrate 118 may be typically a p-doped layer of semiconductor material, e.g. Silicon. A source diffusion 104 may be separated from the drift region 116 by a body region 122. A body contact diffusion 124 connects to the body region 122. A source and body metallization 102 makes ohmic contact to source diffusion 104 and body contact diffusion 124. Insulated gate 106 overlies part of the body 122, to invert a surface portion thereof to form a channel when the gate voltage is sufficiently positive. A drain metallization 112 makes contact to a drain diffusion 114. The drift region 116 is overlain by an insulating layer 108, containing permanent charge 110 (e.g. implanted negative ions) near the semiconductor interface. (Alternatively, the insulating layer 108 can be composed of more than one layer of different dielectric materials, and trapped charge can also be present at an internal dielectric-dielectric interface.)

At zero bias, the permanent charge 110 in dielectric layer 108 is balanced mainly by the charge of a shallow inversion layer (not shown) which forms at the silicon-dielectric interface (between layers 108 and 116). At reverse bias, the positive depletion charge in the n-drift layer 116 is balanced by the negative permanent charge 110 and the negative charge of the p-substrate 118 depletion layer. This provides a more uniform electric field distribution, and hence a higher breakdown voltage. Furthermore, for a given breakdown voltage, the drift n-layer 116 can now be given a higher doping density than conventional structures: this advantageously reduces on-resistance.

The charge in the dielectric layer 108 is preferably located at or close to the silicon-dielectric interface for maximum effectiveness. Charge balance obtained by using permanent charge in the dielectric layers rather than PN junctions also results in lower capacitances. Another advantage is that fabrication can be simpler and more economical.

Figure 2A:
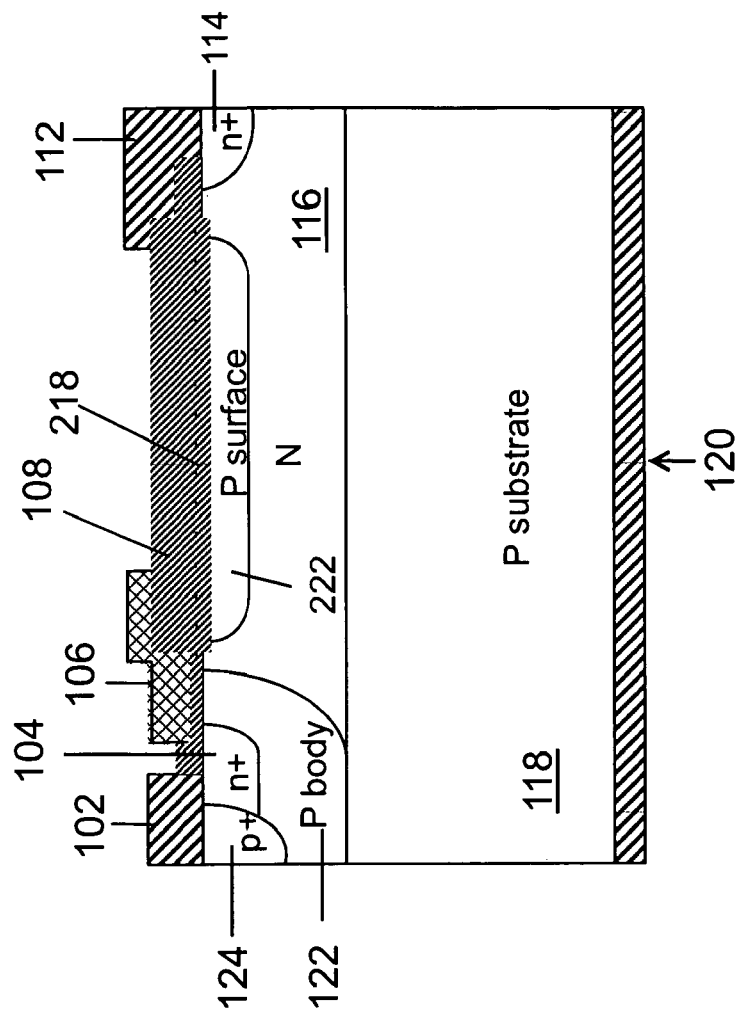
FIG. 2(*a*) is a structural diagram depicting a lateral device in accordance with an embodiment.
Figure 2C:
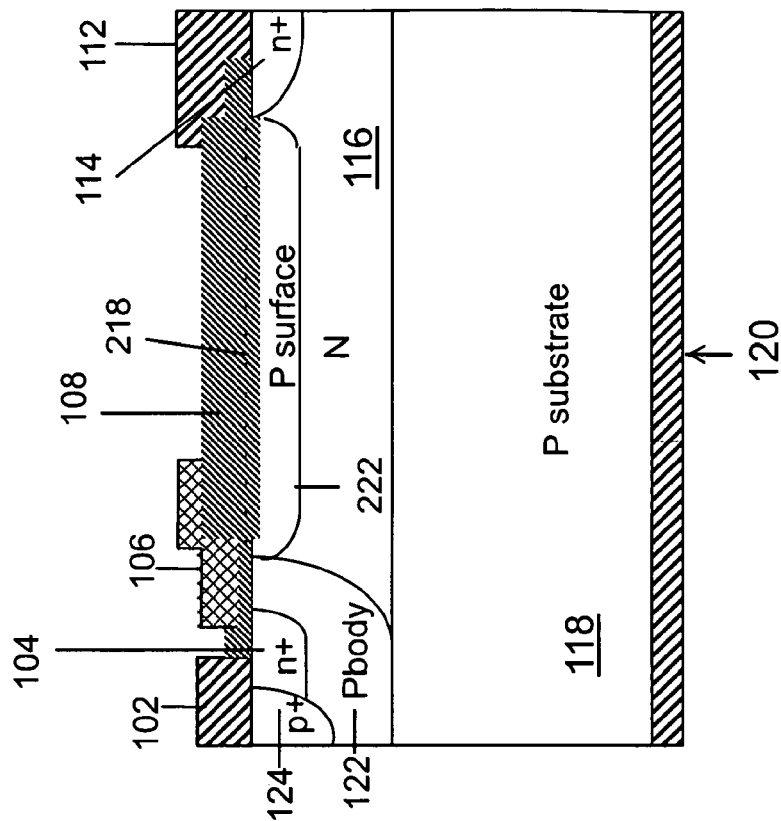
Figure 2B:
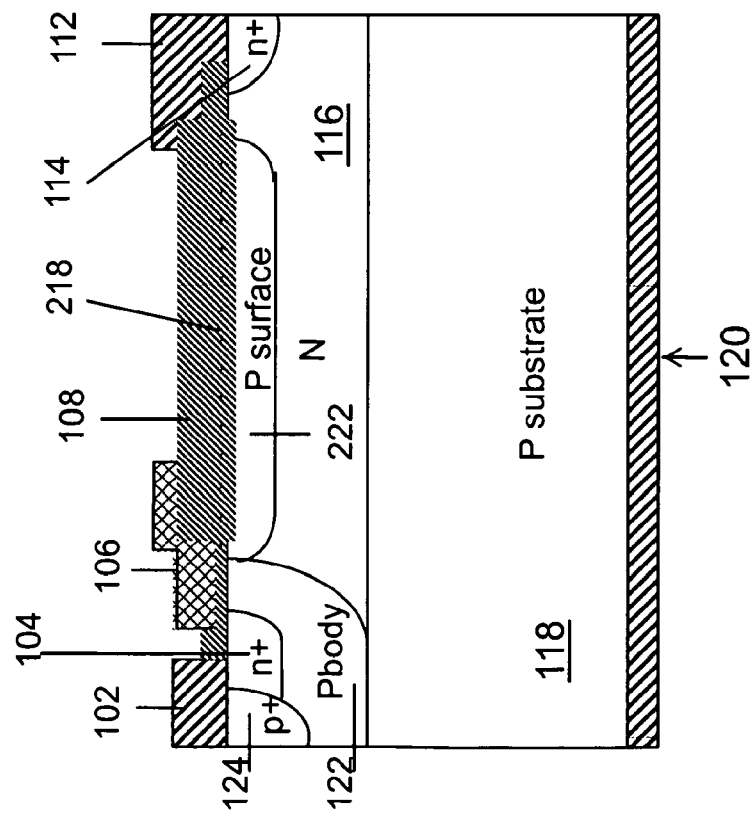

FIGS. 2(a), 2(b), and 2(c) show alternative embodiments 200, 201, and 203 respectively. In these embodiments, a shallow p-type diffusion 222 is added into the drift region 116. The p-surface layer 222 can be electrically floating, or can be connected to the p-body 122 or substrate 118 in some regions of the device. Positive permanent charge 218 is disposed within the insulator layer 108, above the p-type surface layer 222. In the on-state, electron current flows through the channel induced by the gate 106 to the drain 112 via the n-type epitaxial drift layer 116. The positive permanent charge 218 will deplete the p-type surface layer 222, and may even invert region 222 to provide an additional inversion layer conduction path between the drain 114 and channel. This second conduction path reduces the specific on-resistance Rsp of the device.

In the off-state, the permanent charge 218 terminates ionized donors in the depletion region of surface p-layer 222. This reduces the electric field seen laterally between the drain 112 and source 104. The permanent charge 218, in combination with shallow diffusion 222, provides improved charge balancing in the off state.

FIGS. 2(b) and 2(c) show modifications of the embodiment of FIG. 2(a), in which no spacing is provided between the P-surface diffusion 222 and the P-body 122. In FIG. 2(c), there is also no spacing between the diffusion 222 and the drain 114. In the on state the positive permanent charge 218 partially depletes and inverts surface layer 222 to provide an inversion layer conduction path between the drain 114 and channel.

Figures 3, 4:
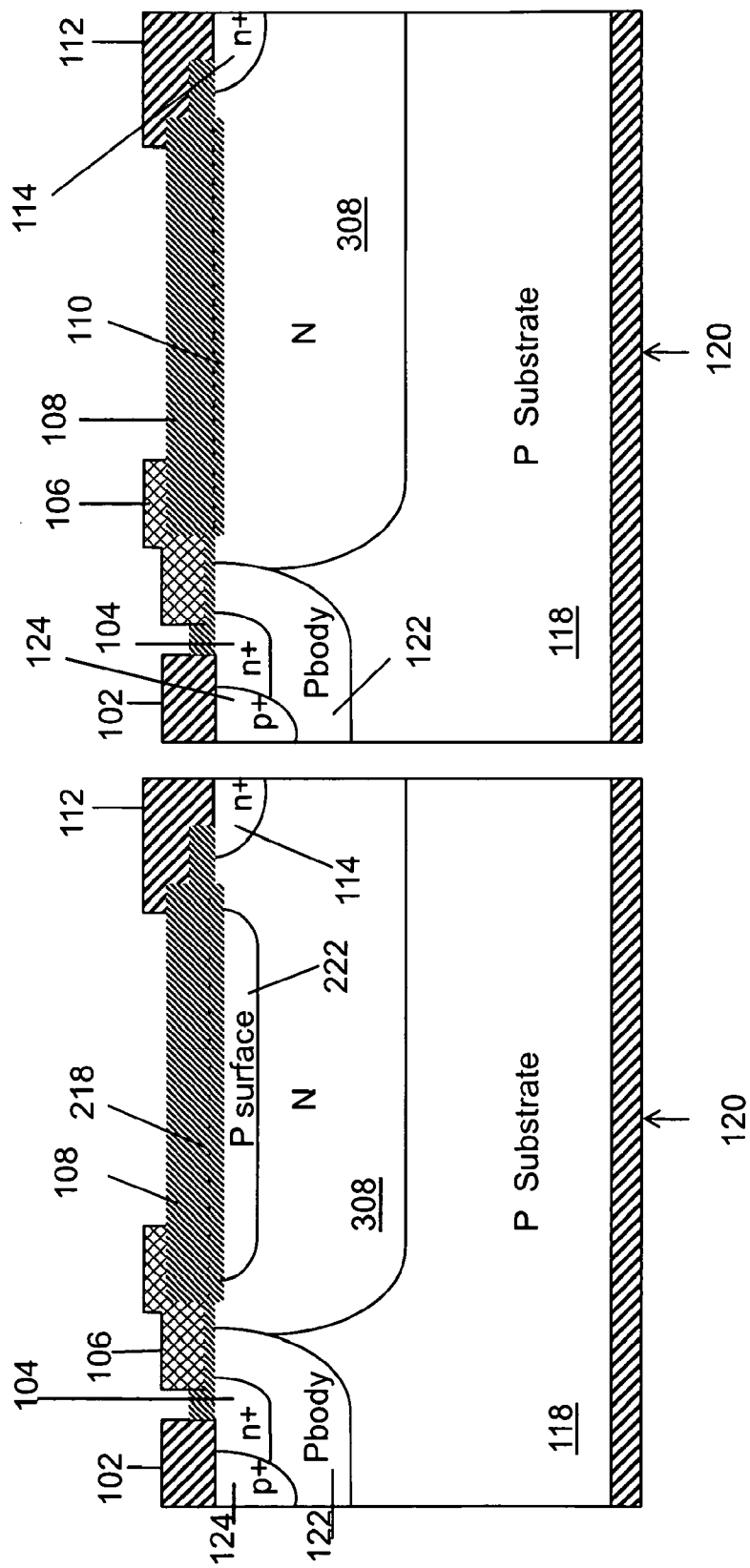
FIG. 3 is a structural diagram depicting a lateral device in accordance with an embodiment.
FIG. 4 is a structural diagram depicting a lateral device in accordance with an embodiment.

FIG. 3 shows another embodiment 300 which differs from the device shown in FIG. 2(a). In this embodiment the epitaxial layer is either p-type or not present, and the n-type drift region 308 is formed by an n-type well diffusion. Again, the permanent charge 218, in combination with shallow diffusion 222, provides improved charge balancing in the off state.

FIG. 4 shows another embodiment 400. Here too the n-type drift region 308 is formed by an n-type well. Permanent charge 110, analogous to that shown in FIG. 1, provides improved charge balancing.

FIG. 5 shows an alternative embodiment 500, in which an additional p-type (p-buried) layer 526 is located in the drift region 116. The p-buried layer 526 can be electrically floating or connected to the p-body 122 or substrate 118 in certain regions of the device. Disposed within the insulator layer 108 above the n-type epitaxial layer 116 is negative permanent charge 110. In the on-state, the electron current flows to the drain region through the two n-type regions 506 lying above and below the buried p-type region 526. The permanent charge 110 and the p-type buried region 526 partially deplete the n-type drift layer 506. In the off-state, depletion charge in the top n-type epitaxial region 506 is partially terminated by ionized acceptors in the p-type buried region 526 as well as by the permanent charge 110.

FIG. 6 shows an alternative embodiment 600. In this embodiment, a buried layer 526, as in FIG. 5, is combined with a shallow P-surface layer 222. In the off-state, depletion charge in the n-type epitaxial region 116 is partially terminated by ionized acceptors in the two p-type regions 222 and 526.

The p-buried layer 526 can be electrically floating or connected to the p-body 122 or substrate 118 in certain regions of the device. Disposed within the insulator layer 108 above the P-surface diffusion 222 is positive permanent charge 218. In the on-state, the electron current flows to the drain region through the two n-type regions 506 lying above and below the buried p-type region 526. The positive permanent charge 218 will deplete the p-type surface layer 222, and may even invert region 222 to provide an additional inversion layer conduction path between the drain 114 and channel. This second conduction path reduces the specific on-resistance Rsp of the device.

FIGS. 7 and 8 show other embodiments 700 and 800 of the devices shown in FIGS. 5 and 6 respectively, where the n-type epitaxial layer has been replaced with an n-type well diffusion 308.

Figure 9:
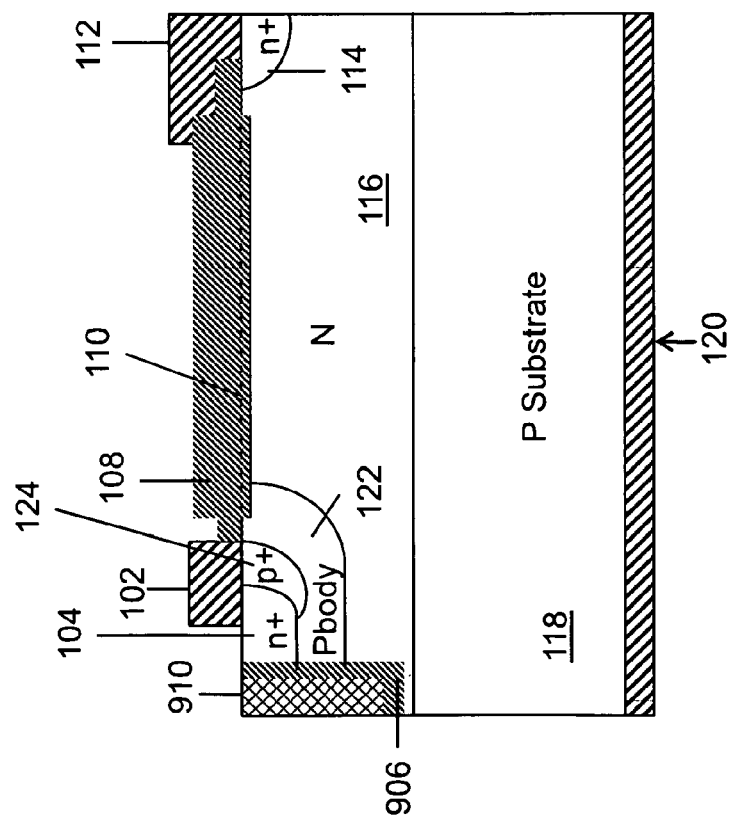
FIG. 9 is a structural diagram depicting a lateral device in accordance with an embodiment.

With reference to FIG. 9, a structural diagram depicts another lateral device embodiment 900. A trench gate 910, surrounded by a gate insulation layer 906, is positioned adjacent to the source region 104 and body 122. A source and body metallization 102 contacts the source region 104 and body contact diffusion 122. In the on-state, the electrons flow vertically downward through the channel (formed where body 122 is nearest the gate electrode 910) into the n-drift layer 116. The n-type layer 116 can be an epitaxial layer or an n-well formed on or in p-substrate 118.

Figure 10:
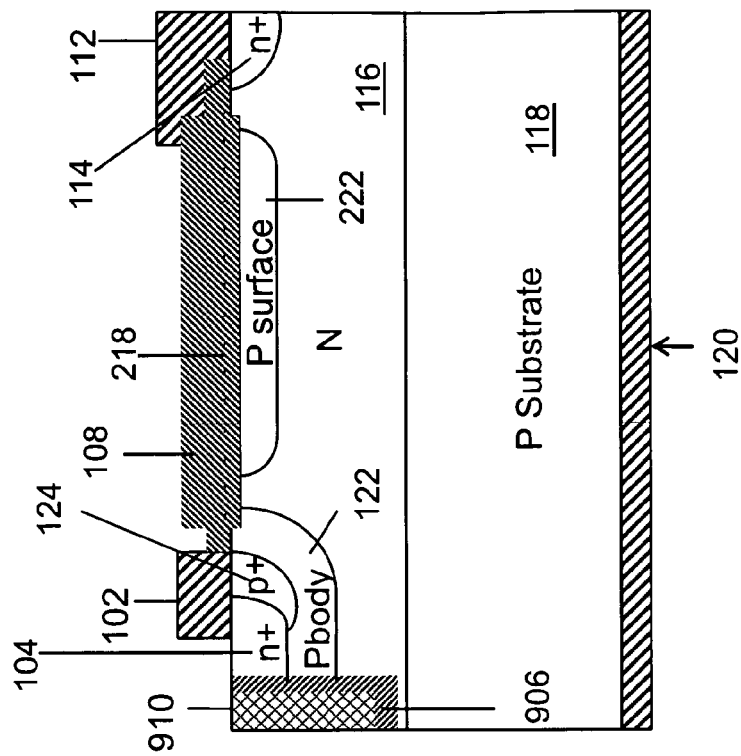
FIG. 10 is a structural diagram depicting a lateral device in accordance with an embodiment.

FIG. 10 shows yet another embodiment 1000. This embodiment uses a source and gate structure like that of FIG. 9, in combination with a shallow diffusion 222 and permanent charge 218 like those of FIG. 2(a) (or (b) or 2(c)), to provide improved off-state characteristics.

Figure 11:
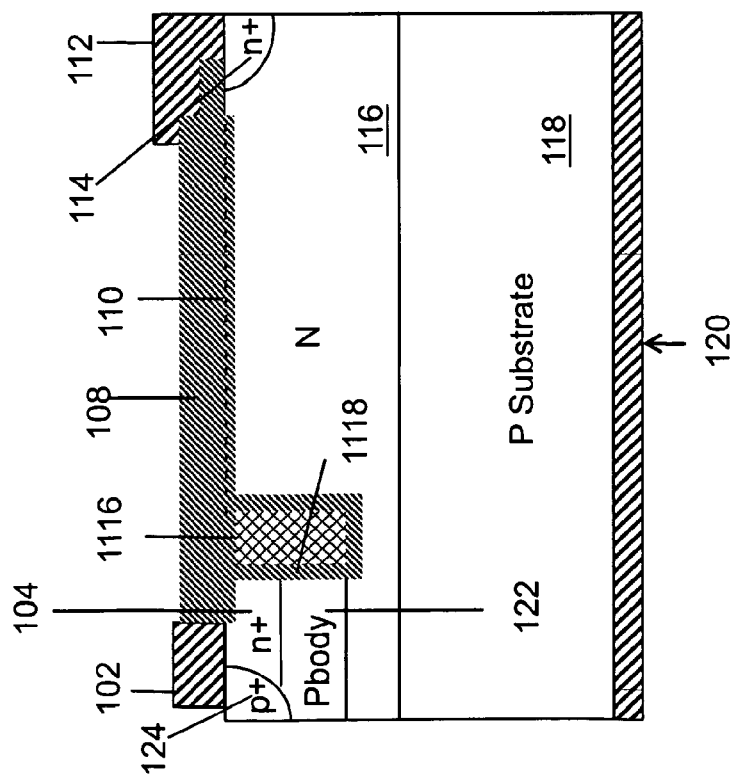
FIG. 11 is a structural diagram depicting a lateral device in accordance with an embodiment.

FIG. 11 shows another embodiment 1100. Here a different trench gate 1116 geometry is used. In the on-state, the electrons flow vertically downward through the channel (formed where body 122 is nearest the gate electrode 1116) into the n-drift layer 116.

Figure 12:
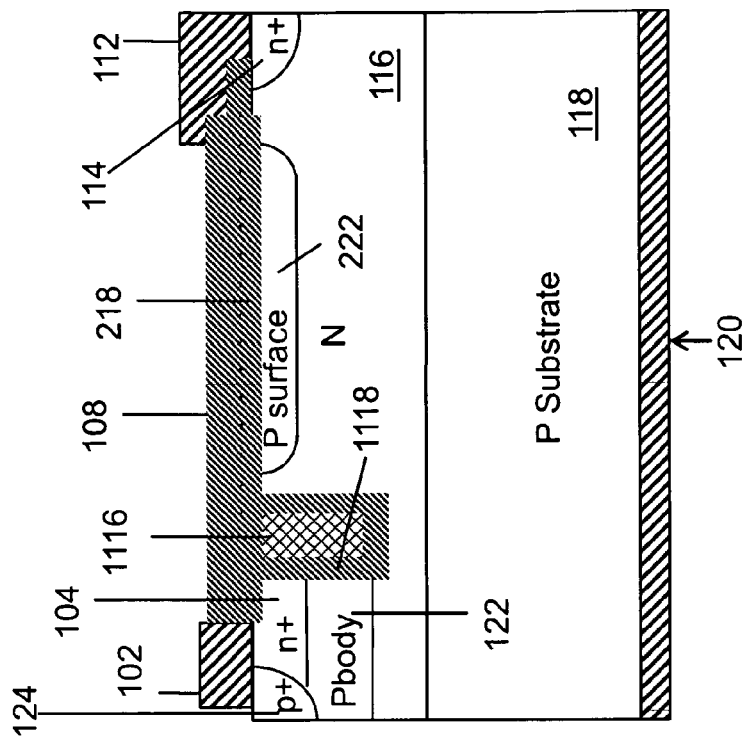
FIG. 12 is a structural diagram depicting a lateral device in accordance with an embodiment.

FIG. 12 shows another embodiment 1200. Note that P surface diffusion 222 and permanent charge 218 combine, as in FIG. 2, to provide improved charge balancing and lower on-resistance.

FIG. 13 shows yet another lateral device embodiment 1300. In this embodiment, a source structure 102 like that of FIG. 9 provides subsurface injection, and buried layer 526 cooperates with permanent charge 110 and substrate 118 to provide charge balancing.

FIG. 14 shows yet another lateral device embodiment 1400. This embodiment is generally similar to that of FIG. 13, except that negative permanent charge 110 has been replaced by p-surface diffusion 222 and positive permanent charge 218.

FIGS. 15 and 16 show two more embodiments 1500 and 1600, which have source 102 and gate structure 1116 analogous to the source structures of FIGS. 11 and 12 but with an additional buried layer 526.

FIGS. 17 and 18 show two more embodiments 1700 and 1800. Here the trench gate 1714 is a T-shaped structure. Note that the laterally extended part of the T can optionally be self-aligned to the permanent charge.

Figure 20:
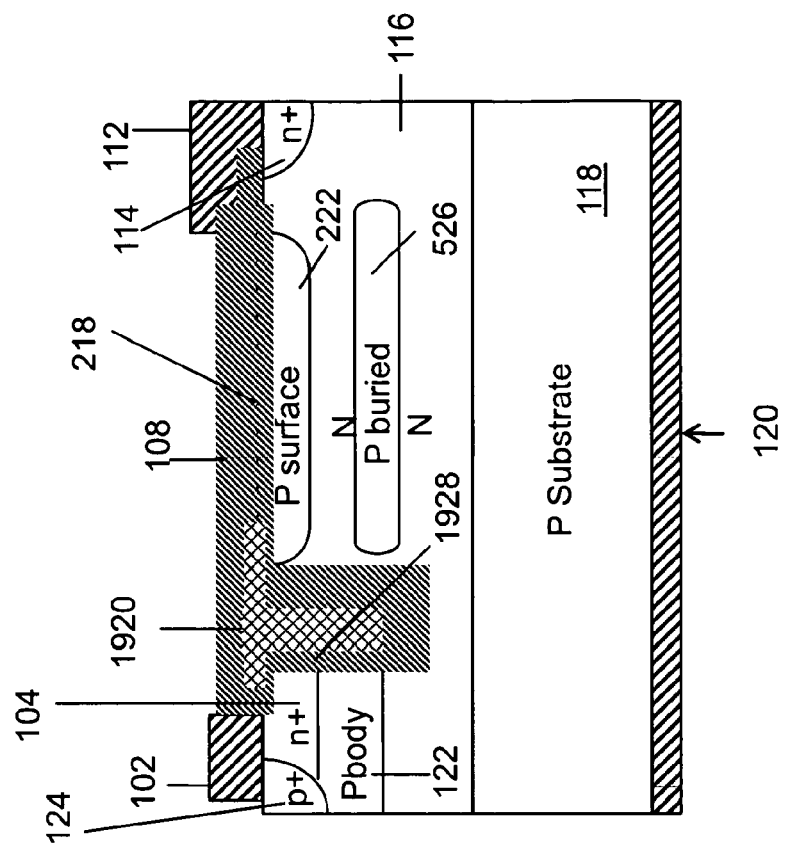
FIG. 20 is a structural diagram depicting a lateral device in accordance with an embodiment.
Figure 19:
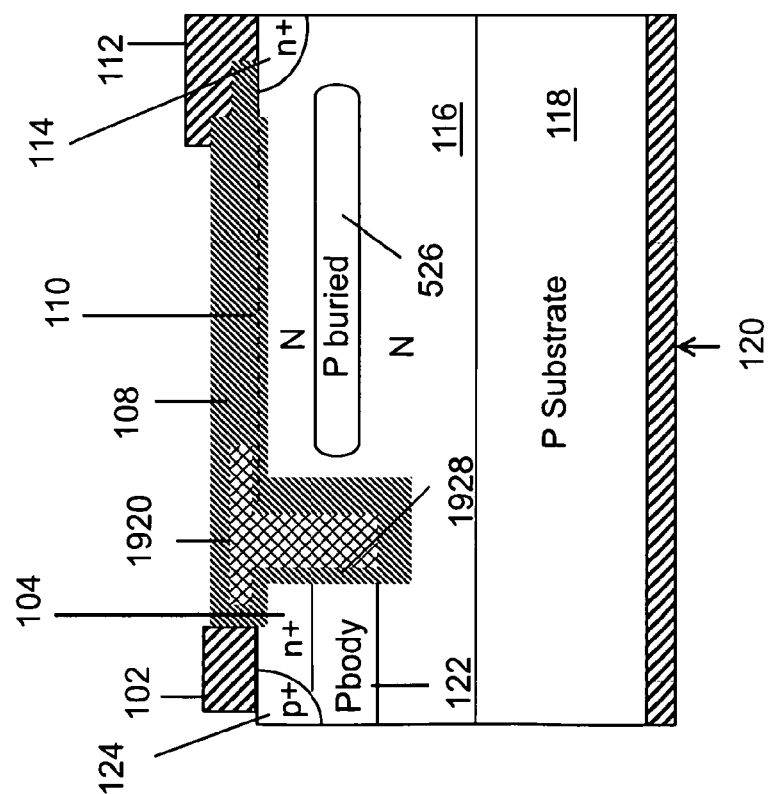
FIG. 19 is a structural diagram depicting a lateral device in accordance with an embodiment.

FIGS. 19 and 20 show two more embodiments 1900 and 2000, which differ from those of FIGS. 17 and 18 in that the gates 1920 are surrounded by an asymmetrical sidewall dielectric 1928. Since the insulation between the gate electrode and the drift region is made thicker, parasitic gate-drain capacitance Cgd is reduced.

Figure 21:
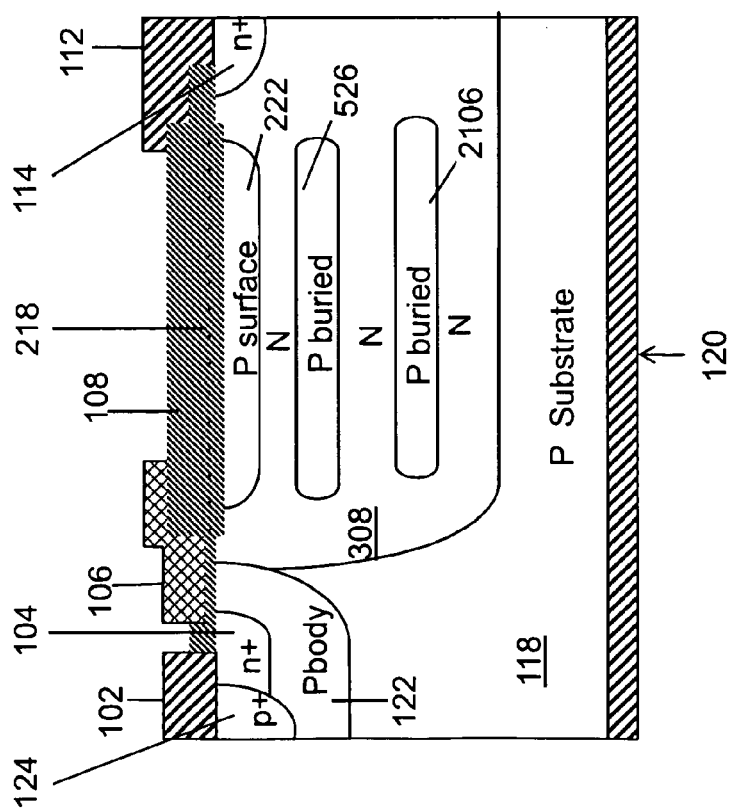
FIG. 21 is a structural diagram depicting a lateral device in accordance with an embodiment.

FIG. 21 shows another lateral device embodiment 2100. In this embodiment, an additional buried layer 2106, in addition to P-surface layer 222 and p-type buried layer 526. The combination of these three p-type layers provides improved charge balancing, especially for a very deep well structure as shown. Note also that this Figure uses a source structure which has a lateral channel, as in FIG. 1.

Figure 22:
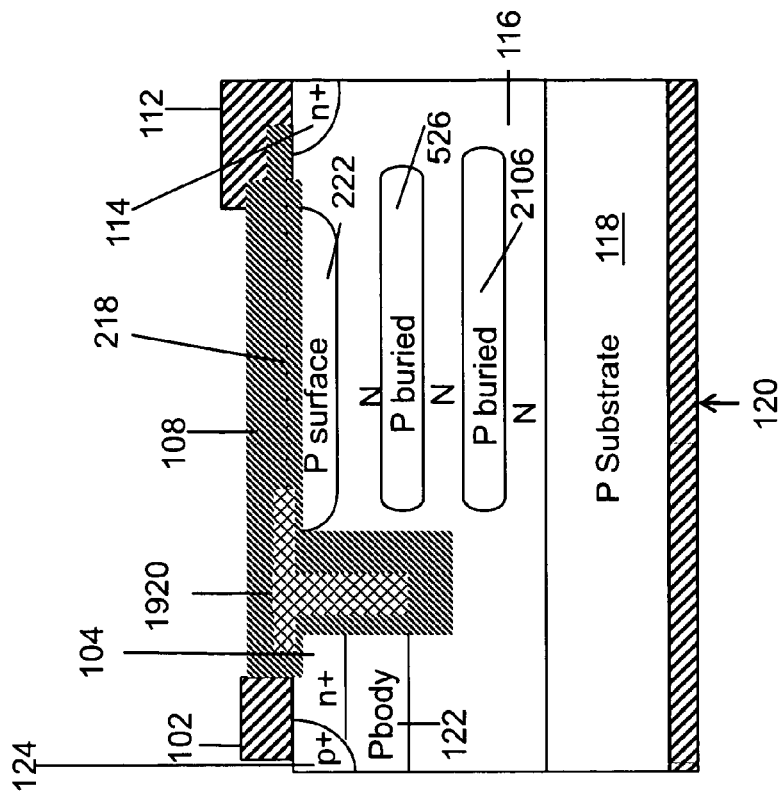
FIG. 22 is a structural diagram depicting a lateral device in accordance with an embodiment.

FIG. 22 shows a lateral device 2200 which has multiple buried layers (like the embodiment of FIG. 21), in combination with a laterally asymmetrical trench gate as in FIG. 20.

Figure 23:
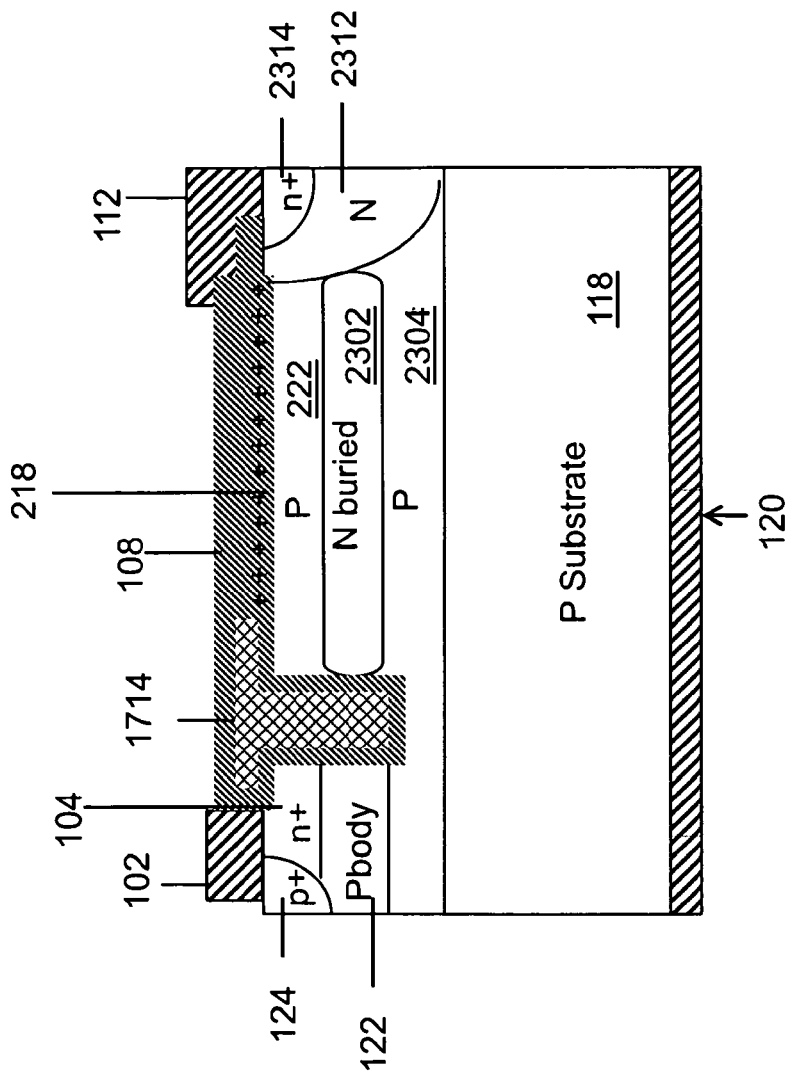
FIG. 23 is a structural diagram depicting a lateral device in accordance with an embodiment.

FIG. 23 shows a significantly different lateral device embodiment 2300. This embodiment is still an NMOS device, but is formed in a p epitaxial on a p-substrate structure. An N-type buried layer 2302 is formed at an intermediate depth in a p-type epitaxial layer 2304.

The majority carrier flow operates somewhat differently in this embodiment, since the P-body adjoins the P-type epi layer 2304. The voltage on the gate electrode not only inverts a channel in the body layer, but also inverts part of the epi layer 2304 and the p-surface layer 222 to form a secondary channel which connects the primary channel to the buried layer 2302 and surface inversion layer created by the permanent charge 218 in p-surface layer 222.

This embodiment also shows a different drain structure, combining a deep drain 2314 with a shallow drain 2312. This drain structure can be used with other embodiments described, or the simpler drain structure of e.g. FIG. 16 can be used in the embodiment of FIG. 23.

According to some disclosed embodiments, there is provided: A lateral semiconductor device comprising: a body region connected to a drain region by a drift region; and permanent charge, sufficient to cause inversion in at least a portion of said drift layer at the interface between the drift layer and the insulation region.

According to some disclosed embodiments, there is provided: A lateral semiconductor device comprising: a drift region between a body region and a drain region, said drift region having a first conductivity type; a surface region on an upper surface of the drift region, said surface region having a second conductivity type; an insulation region over the surface region; and permanent charges embedded in the insulation region, wherein said permanent charges at least partly inverts the surface region.

According to some disclosed embodiments, there is provided: A lateral semiconductor device comprising: a carrier source; a semiconductor drift region laterally interposed between said source and a drain region; and permanent charge, embedded in at least one insulating region which vertically adjoins said drift region, which balances charge in said drift region when said drift region is depleted.

According to some disclosed embodiments, there is provided: A lateral semiconductor device comprising: a first-conductivity-type source region; a second-conductivity-type body region interposed between said source region and a semiconductor drift region; said drift region being laterally interposed between said body region and a first-conductivity-type drain region; and permanent charge, embedded in at latest one insulating region which vertically adjoins said drift region, which has a polarity [e.g. negative] which tends to deplete a layer of said drift region in proximity to said insulating region.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

The doping levels needed to achieve high breakdown and low-resistance are governed by the well-known charge balance condition. The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the specific design parameters needed to operate as intended.

While the figures shown in this disclosure are qualitatively correct, the geometries used in practice may differ and should not be considered a limitation in any way. It is understood by those having ordinary skill in the art that the actual cell layout will vary depending on the specifics of the implementation and any depictions illustrated herein should not be considered a limitation in any way.

While only n-channel MOSFETs are shown herein, p-channel MOSFETs are realizable with this invention simply by changing the polarity of the permanent charge and swapping n-type and p-type regions in any of the figures.

Additionally, while only MOSFETs are shown, many other device structures are implementable using the invention including diodes, IGBTs, thyristors, JFETs, BJTs and the like.

For another example, other source structures can optionally be used, in addition to the numerous embodiments of source structure shown and described above.

For another example, other drain structures can optionally be used, in addition to the various embodiments shown and described above.

It should be noted in the above drawings, the positive and negative permanent charge were drawn for illustration purposes only. It is understood that the charge can be in the dielectric (oxide), at the interface between the silicon and oxide, inside the silicon layer, at an interface within the dielectric, or a combination of all these cases.

The following applications may contain additional information and alternative modifications: Ser. No. 61/125,892 filed Apr. 29, 2008; Ser. No. 61/058,069 filed Jun. 2, 2008 and entitled "Edge Termination for Devices Containing Permanent Charge"; Ser. No. 61/060,488 filed Jun. 11, 2008 and entitled "MOSFET Switch"; Ser. No. 61/084,642 filed Jul. 30, 2008 and entitled "Silicon on Insulator Devices Containing Permanent Charge"; Ser. No. 61/076,767 filed Jun. 30, 2008 and entitled "Trench-Gate Power Device"; Ser. No. 61/080,702 filed Jul. 15, 2008 and entitled "A MOSFET Switch"; Ser. No. 61/074,162 filed Jun. 20, 2008 and entitled "MOSFET Switch"; Ser. No. 61/065,759 filed Feb. 14, 2009 and entitled "Highly Reliable Power MOSFET with Recessed Field Plate and Local Doping Enhanced Zone"; Ser. No. 61/027,699 filed Feb. 11, 2008 and entitled "Use of Permanent Charge in Trench Sidewalls to Fabricate Un-Gated Current Sources, Gate Current Sources, and Schottky Diodes"; Ser. No. 61/028,790 filed Feb. 14, 2008 and entitled "Trench MOSFET Structure and Fabrication Technique that Uses Implantation Through the Trench Sidewall to Form the Active Body Region and the Source Region"; Ser. No. 61/028,783 filed Feb. 14, 2008 and entitled "Techniques for Introducing and Adjusting the Dopant Distribution in a Trench MOSFET to Obtain Improved Device Characteristics"; Ser. No. 61/091,442 filed Aug. 25, 2008 and entitled "Devices Containing Permanent Charge"; Ser. No. 61/118,664 filed Dec. 1, 2008 and entitled "An Improved Power MOSFET and Its Edge Termination"; and Ser. No. 61/122,794 filed Dec. 16, 2008 and entitled "A Power MOSFET Transistor".

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A lateral semiconductor device, comprising:
   a first-conductivity-type source region; a second-conductivity-type body region interposed between said source region and a semiconductor drift region, said drift region being laterally interposed between said body region and a first-conductivity-type drain region;
   a trench gate which is capacitively coupled to adjacent portions of said body region, wherein said source region and said body region are laterally interposed between said trench gate and said drain region; and
   permanent charge, embedded in an insulating region vertically adjoining said drift region, having a polarity which tends to deplete adjacent portions of said drift region.

2. The lateral semiconductor device of claim 1, wherein said drift region is formed as a well.

3. The lateral semiconductor device of claim 1, wherein said trench gate extends laterally over a silicon surface.

4. The lateral semiconductor device of claim 1, further comprising a gate dielectric surrounding said trench gate, and having a thickness, adjoining said body region, which is less than its thickness adjoining said drift region.

5. The lateral semiconductor device of claim 1, further comprising a buried region within said drift region.

6. The lateral semiconductor device of claim 1, further comprising a second buried region.

7. A lateral semiconductor device, comprising:
   a source region;
   a trench gate capacitively coupled to portions of a body region;
   a first-conductivity-type drift region which is laterally interposed between said body region and a drain region;
   a second-conductivity-type surface region in said drift region; and
   permanent charge, embedded in an insulating region which vertically adjoins at least said surface region, having a polarity which tends to deplete adjacent portions of said surface region;
   wherein said body region is laterally interposed between said trench gate and said drain region.

8. The lateral semiconductor device of claim 7, wherein said drift region is formed as a well.

9. The lateral semiconductor device of claim 7, wherein said trench gate extends laterally over a silicon surface.

10. The lateral semiconductor device of claim 7, further comprising a gate dielectric surrounding said trench gate, and having a thickness, adjoining said body region, which is less than its thickness adjoining said drift region.

11. The lateral semiconductor device of claim 7, further comprising a buried region within said drift region.

12. The lateral semiconductor device of claim 11, further comprising a second buried region.

13. The lateral semiconductor device of claim 7, wherein said surface region adjoins said body region.

14. The lateral semiconductor device of claim 7, wherein said surface region adjoins said drain region.

15. A lateral semiconductor device, comprising:
   a source region;
   a body region between a trench gate and a first-conductivity-type drift region, wherein said drift region separates said body region from a drain region;
   a second-conductivity-type surface region at an upper surface of said drift region;
   an insulating region overlying said surface region; and
   permanent charge embedded in said insulating region;
   wherein said permanent charge tends to invert adjacent portions of said surface region.

16. The lateral semiconductor device of claim 15, wherein said drift region is formed as a well.

17. The lateral semiconductor device of claim 15, wherein said trench gate extends laterally over a silicon surface.

18. The lateral semiconductor device of claim 15, further comprising a gate dielectric surrounding said trench gate, and having a thickness, adjoining said body region, which is less than its thickness adjoining said drift region.

19. The lateral semiconductor device of claim 15, further comprising a buried region within said drift region.

20. The lateral semiconductor device of claim 15, further comprising a second buried region.

* * * * *